United States Patent [19]

Schemmel

[11] Patent Number: 4,973,903
[45] Date of Patent: Nov. 27, 1990

[54] ADJUSTABLE PROBE FOR PROBE ASSEMBLY

[75] Inventor: Floyd F. Schemmel, Sherman, Tex.

[73] Assignee: Texas Instruments Incorporated, Dallas, Tex.

[21] Appl. No.: 433,423

[22] Filed: Nov. 8, 1989

Related U.S. Application Data

[63] Continuation of Ser. No. 946,466, Dec. 23, 1986, abandoned.

[51] Int. Cl.[5] .................. G01R 31/02; G01R 1/06
[52] U.S. Cl. .................. 324/158 P; 324/158 F; 439/482
[58] Field of Search .......... 324/158 F, 158 P, 73 PC, 324/72.5; 439/482; 267/181

[56] References Cited

U.S. PATENT DOCUMENTS

| | | | |
|---|---|---|---|
| 3,599,093 | 8/1971 | Oates | 324/158 P X |
| 3,810,017 | 5/1974 | Wiesler et al. | 324/159 F X |
| 3,812,311 | 5/1974 | Kvaternik | 324/725 X |
| 3,849,728 | 11/1974 | Evans | 324/158 F |
| 3,891,924 | 6/1975 | Ardezzone et al. | 324/158 P X |
| 4,034,293 | 7/1977 | Roch | 324/72.5 X |
| 4,043,546 | 8/1977 | Ashfield et al. | 267/181 |
| 4,151,465 | 4/1979 | Lenz | 324/158 P |
| 4,161,692 | 7/1979 | Tarzwell | 324/158 F X |
| 4,267,507 | 5/1981 | Guerpont | 324/158 F X |
| 4,599,559 | 7/1986 | Evans | 324/158 F |
| 4,618,821 | 10/1986 | Lenz | 324/72.5 X |

Primary Examiner—Reinhard J. Eisenzopf
Assistant Examiner—Vinh P. Nguyen
Attorney, Agent, or Firm—B. Peter Barndt; James T. Comfort; Melvin Sharp

[57] ABSTRACT

An adjustable probe to be utilized in probe card technology during the multiprobe electrical testing of integrated circuits. The adjustable probe includes a pair of slots for expansion/contraction and adjustment to obtain a high degree of planarization and placement accuracy of the probe needle.

18 Claims, 1 Drawing Sheet

ADJUSTABLE PROBE FOR PROBE ASSEMBLY

This application is a continuation, of application Ser. No. Ser. No. 06/946,466, filed Dec. 23, 1986, now abandoned.

BACKGROUND OF THE INVENTION

1. Field of the Invention

This invention relates to probes for probe card assemblies.

2. Brief Description of the Prior Art

Probe assemblies are well known in probe card technology for checking integrated circuit, usually on a semiconductor wafer prior to scribing. Such probe assemblies usually contain a plurality of probes of electrically conductive material connected to a probe card, each probe usually having an electrically conductive body to which is connected an electrically conductive metal member in the form of a thin needle shape with a bent tip. The needles are designed to contact the various pads on the unscribed chips formed on the wafer with the bent tip and then to transmit thereto and receive therefrom electrical signals to determine operability of the chips on the wafer prior to further processing of the chips thereon, such as scribing, packaging and the like. This procedure eliminates further operation on faulty chips to provide the obvious economic advantages derived therefrom.

In order to perform the above noted tests, it is necessary that the probe assembly, which contains a sufficient number of probes thereon to contact anywhere from a portion of the pads on a single chip to all of the pads on the chip, be placed in contact with such pads. It is necessary that all of the probes contact their respective pads at substantially the same time and with substantially the same pressure. This is necessary because, if the probe tips are at different vertical positions relative to the pads with which they are associated, different forces are applied to the pads, depending upon the initial positions of the probe tips. This difference in force causes a variation in contact resistance with possible mistest of the chip and can even cause punch through of the pads. In addition, due to this problem of differences in vertical positioning of the probe tips, often some of the probes do not contact the chip surface or the pads thereon at all. It is desirable that the needle tips be within a range of about one mil from the first to touch to the last to touch. In addition, in view of the very small dimensions involved in chip and pad size, very small positioning errors can cause the probe tips to completely miss a pad during the testing operation. It is therefore apparent that the probe assemblies must be checked out to insure accurate positioning of each probe member along the plane of the chip surface as well as in a direction normal to the plane of the chip surface to be certain that precise contact with the pads is being made and at the proper pressure.

In the prior art, the positioning of mispositioned probes was corrected by taking a small hook or prod and bending on the probe needle. This type of needle adjustment was very imprecise and awkward. It was not only necessary to adjust the needle tip precisely, but also necessary that the adjustment be maintained. The needles, which are formed of electrically conductive materials, such as tungsten or beryllium copper, preferably have some spring action therein and have a tendency to return to their original position, this property being commonly known as metal memory. This problem of metal memory results in the requirement for continual rebending of the probes to keep them planar. In addition, the bending of the thin probe needle caused premature fatigue due to the stress at the location of the bend. It is therefore readily apparent that a simpler and more accurate method of adjusting the position of probe needles would be highly desirable in the present state of the art.

SUMMARY OF THE INVENTION

In accordance with the present invention, there is provided a probe for a probe tip assembly which is easily adjusted in two dimensions, vertically (up and down) and in the horizontal "x" plane with the aid of a tool and which retains its adjusted position wherein the memory problem of the prior art is not a concern. The third dimension is in the horizontal "y" plane and is an unwanted side effect of the vertical adjustment which can be minimized by the initial positioning of the needles at a small angle relative to the upper surface of the chip under test.

Briefly, the probe of the present invention, in accordance with a first embodiment thereof, comprises an L-shaped body of electrically conductive material, such as, for example, Olin 194 which is brass based with a plating of tin and copper having a long and a short leg. While the preferred embodiment as disclosed herein relates to an L-shaped body having a long leg and a short leg, it should be understood that neither the L-shape nor the difference in leg size is mandatory. For example, the long and short legs could be interchanged or the body could be straight with the needle attached, the adjustment concept being of much greater importance herein than the shape. The probe needle, which is preferably of tungsten or beryllium copper, though almost any resilient electrically conductive metal can be used, is secured, with low temperature solder or other electrically conductive bonding material, along the end edge of the probe body. A pair of adjustment slots is provided in the L-shaped body, preferably in the long leg of the "L", one of the slots preferably having a hole at the interior end thereof of diameter greater than the width of the slot with which it is associated. A tool having a handle and a U-shaped or semicircular bit portion is positionable and rotatable in either slot to move the needle in a horizontal "x" axis direction. The tool can be placed in the forward (adjustment) slot and moved in a forward direction to move the needle down and in a backward direction to move the tip up.

In accordance with a second embodiment of the invention, the structure and materials used are the same as in the first embodiment. In addition, the slot having the hole at its interior end is serpentine in shape, somewhat in the form of an "S", and commences along one edge of the large leg in a direction normal to the major axis thereof, then extends along or parallel to the major axis of the large leg to then extend along a path in the shape of the arc of a circle and then in a direction along the major axis of the short leg of the "L" which is normal to the major axis of the large leg to terminate therein at the hole. Again, it should be understood that, while a serpentine shaped slot is discussed in the preferred embodiment, it is merely necessary that a slot be present, the shape of the slot being of secondary importance. It is preferred that the hole be positioned as close as possible to the needle to minimize the angle formed by the bottom of the hole in the slot to the needle tip with respect to the horizontal plane. The larger this angle, the larger the unwanted "y" axis horizontal movement will be. This horizontal "y" movement occurs during the vertical adjustment of the tip and is an unwanted effect of the vertical movement. It is also necessary that sufficient material be left between the hole and the edge of the short leg to minimize memory and return of the probe to its original position. It is therefore apparent that a tradeoff is made as to the position of the hole. As in the first embodiment, the diameter of the hole is larger than the width of the slot. The position of the needle tip is adjusted using the same tool as in the first embodiment and in the same manner. The serpentine shaped slot allows the placement of the hole on a minimum angle to the probe tip with respect to the horizontal plane as noted hereinabove.

DESCRIPTION OF THE PREFERRED EMBODIMENTS

Figure 1:
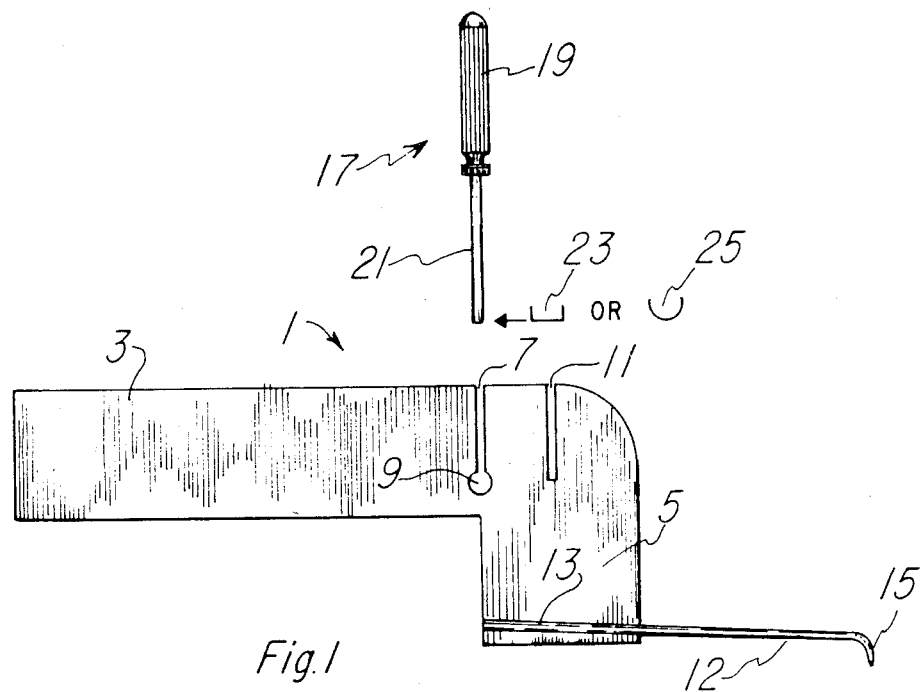
FIG. 1 is a side view of a probe in accordance with a first embodiment of the present invention with tool.

Referring first to FIG. 1, there is shown a first embodiment of a probe 1 in accordance with the present invention. The probe includes an L-shaped body having a long section 3 and a short section 5 formed of electrically conductive material, preferably a brass based alloy with a tin with copper plating, such as Olin 194. A first slot 7 is positioned in the long leg 3 with its axis along one side of the short leg. A hole 9 is formed at the interior end of the slot 7, the diameter of the hole being larger than the width of the slot 7. A second slot 11 is formed with its axis parallel to the slot 7 and at about the midpoint of the short leg 5. A probe needle 12, which is formed of electrically conductive resilient material, is secured to the end edge portion of the small leg 5 and is either parallel to the axis of the large leg 3 or makes a small angle therewith. The needle 12 and leg 5 are secured to each other by an electrically conductive bonding material, such as solder. The end portion of the needle 12 has a curvature which is preferably about 85 to about 89 degrees with respect to the chip pad, the needle contacting the pad at that angle. This end portion extends to the needle tip 15, the tip making contact with the chip bonding pads in actual use.

As shown in FIG. 1, there is also provided a tool 17 having a handle 19 and a bit 21. The bit 21 can be U-shaped as shown at 23 or of circular shape as shown at 25.

In operation, if the bit 21 of the tool 17 is positioned in the slot 7 or preferably slot 11 and moved forward in the direction of the tip 15, it will cause rotation of the leg 5 about the hole 9 to move the needle tip 15 downwardly. This action will also cause some expansion of leg 3 at the slot 7 and hole 9 to move the needle tip 15 to the left as shown in FIG. 1, this being the unwanted movement in the "y" direction discussed hereinabove. Placement of the bit 19 in the slot 11 and movement thereof in a direction away from needle tip 15 will cause the needle tip to move upwardly as well as cause some contraction of leg 3 at the slot 7 and hole 9. Placement of the bit 21 in either of slots 7 or 11 and rotation thereof will cause the needle tip 15 to move either into or out of the paper as shown in FIG. 1. It is therefore apparent that the needle tip 15 is capable of movement in two desired mutually substantially perpendicular directions for adjustment relative to a pad.

Figure 2:
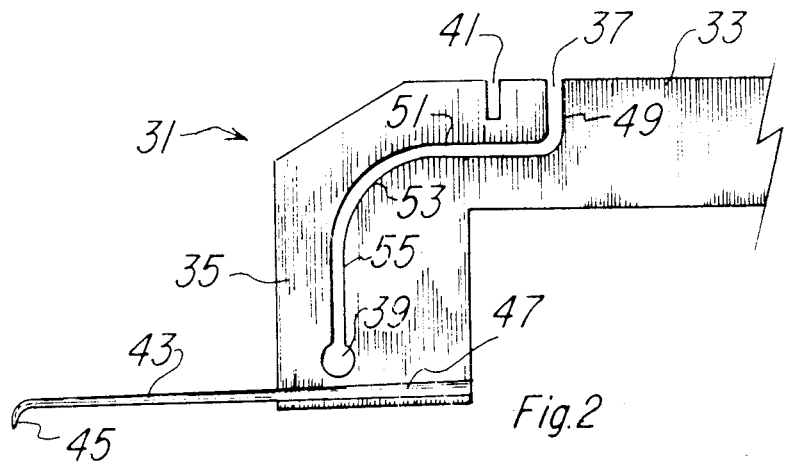
FIG. 2 is a side view of a probe in accordance with a second embodiment of the present invention.

Referring now to FIG. 2, there is shown a second embodiment of a probe in accordance with the present invention. The probe 31 includes an L-shaped body having a long section 33 and a short section 35 formed of electrically conductive material, preferably a brass based alloy with a tin with copper plating, such as Olin 194. It is again noted that this electrically conductive material, as in the other embodiments herein, can be any suitable electrically conductive solderable material. A first slot 37 is positioned in the long leg 33 away from the junction of the leg portions 33 and 35 relative to the slot 41 which is adjacent on side of the leg 35. A hole 39 is formed at the interior end of the slot 37, the diameter of the hole being larger than the width of the slot 37. The path from the slot 37 to the hole 39 is serpentine an includes a straight portion 49 which is normal to the axis of the leg 33, a second portion 51 extending from the portion 49 which is along the axis of leg 33, a curved portion 53 which is substantially one fourth of a circle and a further straight portion 55 which is parallel to the axis of the leg 35 and normal to the axis of the leg 33. The hole 39 is formed at the end of the section 55 of the slot 37. A probe needle 43, which is formed of electrically conductive resilient material, is secured to the end edge portion of the small leg 35 and is either parallel to the axis of the large leg 33 or makes a small angle therewith. The needle 43 and leg 35 are secured to each other by an electrically conductive bonding material, such as solder. The end portion of the needle 43 has a curvature between about 85 and about 89 degrees with respect to the chip pad with which it will make contact extending to the needle tip 45, the tip making contact with the chip bonding pads in actual use.

In operation, using the same tool as discussed hereinabove with reference to the embodiment of FIG. 1, if the bit 21 of the tool 17 is positioned in the slot 37 or 41, preferably slot 41 and moved forward in the direction of the tip 45, it will cause rotation of the leg 35 about the hole 39 to move the needle tip 45 downwardly. This action will also cause some expansion of leg 33 at the slot 37 and hole 39 to move the needle tip 45 to the right as shown in FIG. 2 as discussed hereinabove. Placement of the bit 19 in the slot 41 and movement thereof in a direction away from needle tip 45 will cause the needle tip to move upwardly as well as cause some of the above noted unwanted contraction of leg 33 at the slot 37 and hole 39. Placement of the bit 21 in either of slots 37 or 41 and rotation thereof will cause the needle tip 45 to move either into or out of the paper as shown in FIG. 2. It is therefore apparent that the needle tip 45 is capable of movement in two desired mutually substantially perpendicular directions for adjustment relative to a pad.

Though the invention has been described with respect to preferred embodiments thereof, many variations and modifications will immediately become apparent to those skilled in the art. It is therefore the intention that the appended claims be interpreted as broadly as possible in view of the prior art to include all such variations and modifications.

I claim:
1. An adjustable probe which comprises:
  (a) a substantially L-shaped electrically conductive probe body, said L having first and second legs;

(b) an electrically conductive needle secured to an edge portion of one of said legs remote from the other of said legs; and (c) slot means extending from a top surface of said body to a distance within said body dividing said body into a first portion and a second portion, said first portion being positionable relative to said second portion about said slot means, said slot means including a pair of non-communicating slots, at least a portion of one of said slots being parallel to the other of said slots.

2. A probe as set forth in claim 1 wherein said slot means includes a pair of slots, each of said slots extending from an edge of said long leg, one of said slots extending into said short leg, said one slot having a hole at one end thereof having a diameter greater than the width of said slot, said hole enhancing adjustability of said probe.

3. A probe as set forth in claim 2 wherein said one slot extends normal to the major axis of said long leg, then substantially parallel to said major axis of said long leg and then in said short leg in a direction substantially normal to said major axis of said long leg.

4. An adjustable probe which comprises:
(a) a substantially L-shaped electrically conductive probe body;
(b) an electrically conductive needle secured to an edge portion of one of said legs remote from the other of said legs; and
(c) slot means extending from a top surface of said body to a distance within said body dividing said body into a first portion and a second portion, said first portion being positionable relative to said second portion about said slot means, said L including a long leg and a short leg, said needle being secured to an edge portion of said short leg remote from said long leg, said slot means including a pair of non-communicating slots, at least a portion of one of said slots being parallel to the other of said slots, said portions of said slots being substantially normal to the major axis of said long leg.

5. A probe as set forth in claim 4 wherein said slot means includes a pair of slots, each of said slots extending from an edge of said long leg, one of said slots extending into said short leg, said one slot having a hole at one end thereof having a diameter greater than the width of said slot, said hole enhancing adjustability of said probe.

6. A probe as set forth in claim 5 wherein said one slot extends normal to the major axis of said long leg, then substantially parallel to said major axis of said long leg and then in said short leg in a direction substantially normal to said major axis of said long leg.

7. An adjustable probe which comprises:
(a) an electrically conductive probe body;
(b) an electrically conductive needle secured to an edge portion of said body; and
(c) slot means in said body dividing said body into a first portion and a second portion, said first portion being movable relative to said second portion about said slot means,
wherein said slot means includes a pair of slots, one of said slots being of serpentine shape and having a hole at the end thereof having a diameter greater than the width of said one slot, said hole enhancing adjustability of said probe.

8. A probe as set forth in claim 7 wherein said one slot extends normal to the major axis of said long leg, then substantially parallel to said major axis of said long leg and then in said short leg in a direction substantially normal to said major axis of said long leg.

9. An adjustable probe which comprises:
(a) an electrically conductive probe body;
(b) an electrically conductive needle secured to an edge portion of said body; and
(c) slot means extending from a top surface of said body to a distance within said body dividing said body into a first portion and a second portion, said first portion being positionable relative to said second portion about said slot means, wherein said probe body is substantially L-shaped, wherein said slot means includes a pair of slots, one of said slots extending from one leg of said "L" to the other leg of said "L" and a hole at the end of said one slot having a diameter greater than the width of said one slot, said hole enhancing adjustability of said probe.

10. A probe as set forth in claim 9 wherein said one slot extends normal to the major axis of said long leg, then substantially parallel to said major axis of said long leg and then in said short leg in a direction substantially normal to said major axis of said long leg.

11. An adjustable probe which comprises:
(a) an electrically conductive probe body;
(b) an electrically conductive needle secured to an edge portion of said body; and
(c) slot means extending from a top surface of said body to a distance within said body dividing said body into a first portion and a second portion, said first portion being positionable relative to said second portion about said slot means, wherein said probe body is substantially L-shaped, wherein said "L" includes a long leg and a short leg, said needle being secured to said short leg, wherein said slot means includes a pair of slots, each of said slots extending from an edge of said long leg, one of said slots extending into said short leg, said one slot having a hole at one end thereof having a diameter greater than the width of said slot, said hole enhancing adjustability of said probe.

12. A probe as set forth in claim 11 wherein said one slot extends normal to the major axis of said long leg, then substantially parallel to said major axis of said long leg and then in said short leg in a direction substantially normal to said major axis of said long leg.

13. An adjustable probe which comprises:
(a) an electrically conductive probe body;
(b) an electrically conductive needle secured to an edge portion of said probe body;
(c) said probe body having a first slot extending from a top surface of said body to a distance within said body dividing said probe body into a first portion and a second portion, said first portion positionable relative to said second portion about said first slot, said probe body further including a second slot extending to a surface of said body in non-communicating relation with said first slot.

14. An adjustable probe which comprises:
(a) an electrically conductive probe body; and
(b) an electrically conductive needle secured to an edge portion of said probe body;
(c) said probe body having a slot extending in a first direction from a top surface of said body to a distance within said body dividing said probe body into a first portion and a second portion, said first portion positionable relative to said second portion about said slot, said slot extending in a second direction different from said first direction within said body and having a finite radius of curvature.

15. An adjustable probe which comprises:
    (a) an electrically conductive probe body;
    (b) an electrically conductive needle secured to an edge portion of said probe body, said probe body having a slot extending from a top surface of said body to a distance within said body dividing said probe body into a first portion and a second portion, said first portion being positionable relative to said second portion about said slot, wherein said slot comprises a first slot portion having a predetermined width and a terminal end having a width greater than said predetermined width.

16. A probe as claimed in claim 15 wherein said terminal end is substantially circular in shape.

17. An adjustable probe which comprises:
    (a) an electrically conductive probe body; and
    (b) an electrically conductive needle secured to an edge portion of said probe body;
    (c) said probe body having a first slot extending from a top surface of said body to a distance within said body dividing said probe body into a first portion and a second portion, said first portion being positionable relative to said second portion about said first slot;
    (d) said probe body further including a second slot extending from a surface portion of said body to a distance within said body and non-communicating with said first slot.

18. An adjustable probe which comprises:
    (a) an electrically conductive probe body;
    (b) said probe body having a slot extending in a first direction from a top surface of said body to a distance within said body dividing said probe body into a first portion and a second portion, said first portion being positionable relative to said second portion about said slot, said slot extending in a second direction different from said first direction within said body and having a finite radius of curvature; and
    (c) an electrically conductive probe secured to said probe body.

* * * * *